United States Patent
McKee

[11] Patent Number: 5,804,088
[45] Date of Patent: Sep. 8, 1998

[54] INTERMEDIATE LAYER LITHOGRAPHY

[75] Inventor: Jeffrey Alan McKee, Hamura, Japan

[73] Assignee: Texas Instruments Incorporated, Dallas, Tex.

[21] Appl. No.: 679,041

[22] Filed: Jul. 12, 1996

[51] Int. Cl.⁶ .................................................. G03C 5/00
[52] U.S. Cl. ............................ 216/47; 430/316; 438/717
[58] Field of Search ................................. 430/313, 316; 216/47; 438/717

[56] References Cited

U.S. PATENT DOCUMENTS

| | | | |
|---|---|---|---|
| 4,092,210 | 5/1978 | Hoepfner | 216/47 |
| 4,557,797 | 12/1985 | Fuller et al. | 438/514 |
| 4,820,611 | 4/1989 | Arnold et al. | 430/271 |
| 5,106,786 | 4/1992 | Brady et al. | 438/655 |
| 5,326,727 | 7/1994 | Kook et al. | 216/47 |
| 5,525,542 | 6/1996 | Maniar et al. | 438/669 |

FOREIGN PATENT DOCUMENTS

| | | |
|---|---|---|
| 0 470 707 A2 | 2/1992 | European Pat. Off. . |
| 0 471 185 A2 | 2/1992 | European Pat. Off. . |
| 56-26442 | 3/1981 | Japan .................................... 430/316 |
| 5-234956 | 9/1993 | Japan ...................................... 216/47 |
| 2 152 223 | 7/1985 | United Kingdom . |

OTHER PUBLICATIONS

VLSI Technology, 1985, pp. 307–310.

*Primary Examiner*—Roland Martin
*Attorney, Agent, or Firm*—Carlton H. Hoel; W. James Brady; Richard L. Donaldson

[57] ABSTRACT

An isotropic or partially isotropic etch shrinks lithographically patterned photoresist (211, 212) to yield reduced linewidth patterned photoresist (213, 214) with a buried antireflective coating also acting as an etchstop or a sacrificial layer. The reduced linewidth pattern (213, 214) provide an etch mask for subsequent anisotropic etching of underlying material such as polysilicon (206) or metal or insulator or ferroelectric.

5 Claims, 5 Drawing Sheets

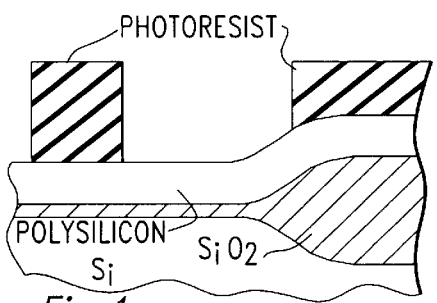
Fig. 1a
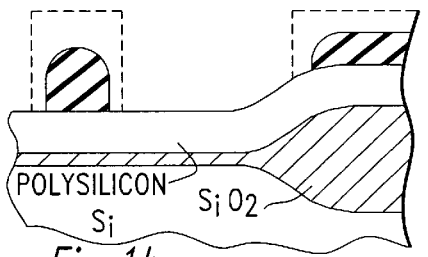
Fig. 1b
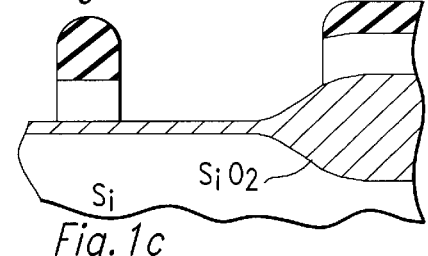
Fig. 1c
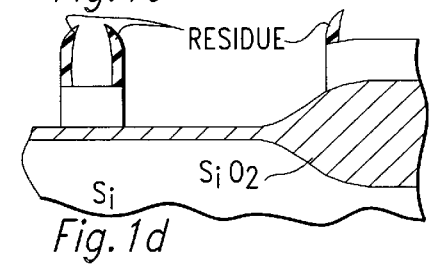
Fig. 1d
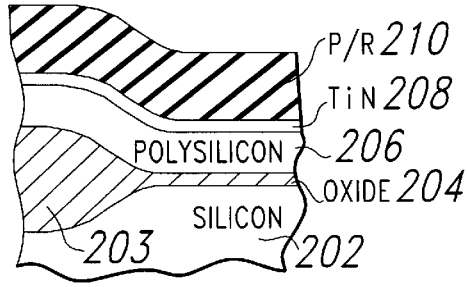
Fig. 2a
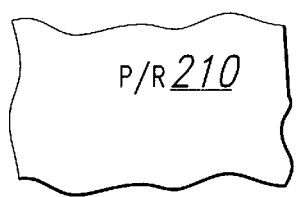
Fig. 2b
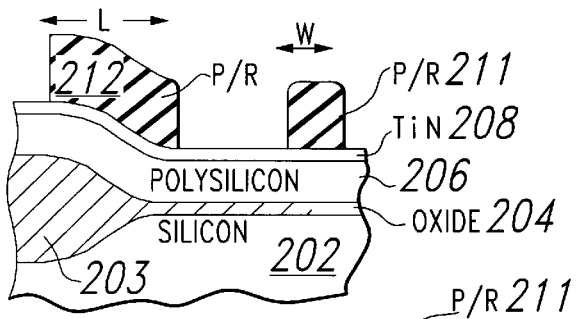
Fig. 2c
Fig. 2d
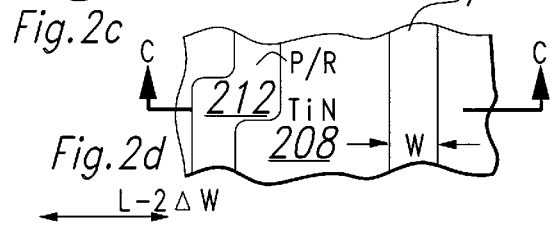
Fig. 2e
Fig. 2f
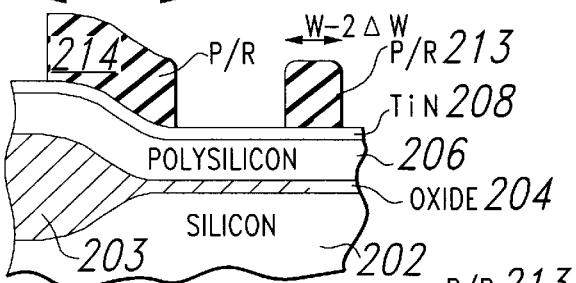
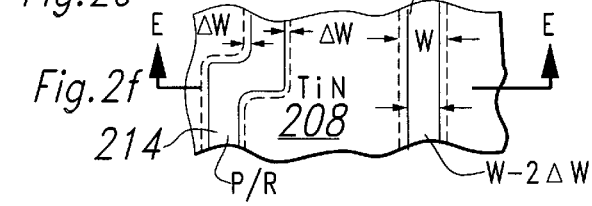
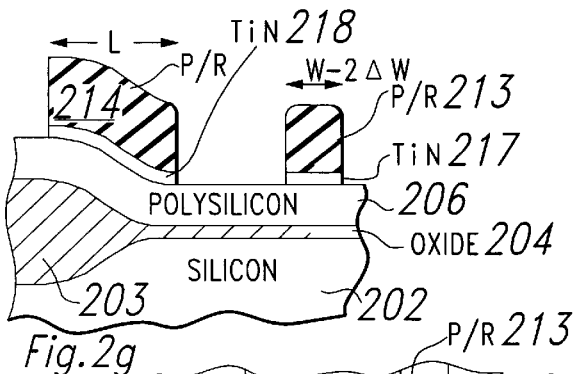
Fig. 2g
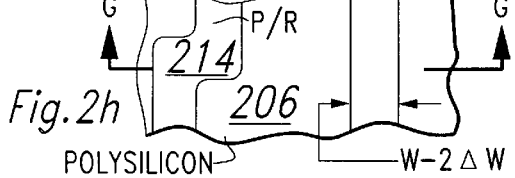
Fig. 2h

INTERMEDIATE LAYER LITHOGRAPHY

CROSS-REFERENCE TO RELATED APPLICATIONS

The following coassigned and cofiled U.S. patent applications disclose related subject matter: application Ser. Nos. 08/680,340, pending filed Jul. 12, 1996 and 08/678,847, pending filed Jul. 12, 1996.

BACKGROUND OF THE INVENTION

The invention relates to electronic semiconductor devices, and, more particularly, to fabrication methods for such devices.

Semiconductor integrated circuits with high device density require minimum size structures such as short gates for field effect transistors (FETs), small area emitters for bipolar transistors, and narrow interconnection lines between devices. The formation of such polysilicon or metal structures typically involves definition of the locations of such structures in a layer of photoresist on a layer of polysilicon or metal by exposure of the photoresist with light passing through a reticle containing the desired structure pattern. After exposure and development of the photoresist, the underlying layer of polysilicon or metal is anisotropically etched using the patterned photoresist as the etch mask. Thus the minimum polysilicon or metal linewidth equals the minimum linewidth that can be developed in the photoresist. Current optical steppers expose the photoresist using light of wavelength 365 nm (called I-line after the corresponding emission line in a high-pressure mercury arc lamp used to generate the light), and pattern linewidths in photoresist of less than about 0.30 µm with a standard deviation of less than about 0.01 µm cannot be satisfactorily generated with I-line lithography.

FIGS. 1a–c illustrate a known method to create sublithographic polysilicon gate structures and includes minimal geometry patterning photoresist on a polysilicon layer (FIG. 1a), isotropically etching the photoresist to reduce linewidth (FIG. 1b), and anisotropically etching the polysilicon with the reduced linewidth photoresist as etch mask (FIG. 1c). This approach has problems including contamination of the polysilicon.

The use of a photoresist mask for anisotropic etching polysilicon gates can leave residual ridges of hardened photoresist on the edges of the polysilicon gates after the etch. Plasma etch species harden the photoresist sidewalls during the polysilicon etch, and the subsequent oxygen plasma photoresist strip may not fully remove the ridges; FIG. 1d. Also, separate wet etches to strip the ridges may be used but lack robustness with respect to modifications. Any ridge residue will carbonize during later heat treatments and impede formation of titanium disilicide (TiSi$_2$) in a self-aligned gate siliication process. Thus simple and complete removal of photoresist residue is a problem.

SUMMARY OF THE INVENTION

The present invention provides sublithographic patterns by use of an intermediate layer between photoresist and material to be etched together with lateral etching of either a lithographically defined photoresist pattern or the intermediate layer to shrink the linewidth. The intermediate layer acts as (1) a antireflective layer for photoresist exposure, (2) as an etchstop or as a sacrificial layer for the subsequent lateral etch, and/or (3) a liftoff layer for removal of hardened photoresist residue.

Advantages of the invention include a simple method for sublithographic patterns and robust photoresist removal.

BRIEF DESCRIPTION OF THE DRAWINGS

The drawings are heuristic for clarity.

FIGS. 1a–d show a known sublithographic pattern method.

FIGS. 2a–h illustrate first preferred embodiment method of photoresist patterning in cross sectional elevation and plan views.

DESCRIPTION OF THE PREFERRED EMBODIMENTS

Overview

Figure 3:
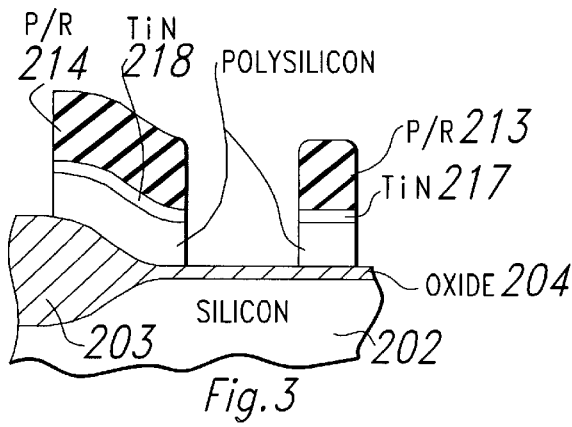
FIG. 3 is a cross sectional elevation view after an anisotropic etch using the first preferred embodiment.

The preferred embodiment methods of sublithographic pattern creation insert an intermediate layer between photoresist and the material to be patterned and use the following steps: first expose and develop a pattern in the photoresist with a minimal linewidth and then laterally (e.g., isotropically) remove photoresist or intermediate layer or both to uniformly shrink the intermediate layer to a subminimal linewidth which then provides the etch mask for the material to be patterned. The intermediate layer may provide (1) an antireflection function during photoresist exposure, (2) an etchstop or a sacrificial layer to protect underlying material layer during the subsequent lateral removal, and/or (3) an etch residue liftoff layer after the material has been patterned.

The sublithographic patterning and residue liftoff can be created over materials such as polysilicon, metal, insulator, ferroelectric, and so forth. The sublithographic pattern may define minimal sized items such as gate length and interconnection linewidth for integrated circuits.

First preferred embodiment

FIGS. 2a–h illustrate the first preferred embodiment photoresist patterning method as could be used to form a mask for gate level polysilicon etching. In particular, begin with monocrystalline silicon substrate 202 having (100) orientation and typically with both p and n type doped well regions for fabrication of devices plus also isolation oxides 203, gate oxide 204 with thickness typically 6–10 nm plus gate level polysilicon layer 206 with thickness typically 300–500 nm and either doped or undoped or doped only in certain portions. Then proceed with the following steps:

(1) Sputter deposit a 55 nm thick layer 208 of titanium nitride (TiN) onto polysilicon 206. TiN layer 208 acts as a buried antireflective coating ("BARC") for I-line lithography; that is, TiN strongly absorbs 365 nm wavelength light. Without TiN or some other BARC, the underlying polysilicon 206 would reflect exposure light penetrating overlying photoresist and cause interference which makes the photoresist's degree of exposure depend upon location because the photoresist thickness varies over protuberances such as isolation oxide 203.

(2) Spin on roughly 1 μm thick I-line photoresist layer 210 onto TiN BARC 208; the thickness of layer 210 depends on the underlying topography. I-line photoresist may be made of cyclized polyisoprene polymers with azide sensitizers. Softbake photoresist 210 if desired. See FIGS. 2a–b for cross sectional elevation and plan views.

(3) Expose photoresist 210 with an I-line lithography system to define a pattern with minimum linewidth of 0.33 μm. Then develop exposed photoresist 210 and bake to yield patterned photoresist portions 211 and 212 as illustrated in FIGS. 2c–d in cross sectional elevation and plan views. The width denoted "W" may be a minimum line width such as 0.33 μm. See FIGS. 2c–d with FIG. 2c being the section along line C—C in plan view FIG. 2d.

(4) Apply an isotropic etch to remove ΔW of photoresist patterns 211–212 to yield photoresist patterns 213–214, but the etch only removes a negligible amount of TiN 208. This isotropic etch may be a plasma etch with 80% helium and 20% oxygen at a pressure of 1.5 mTorr which removes photoresist at a rate of 160 nm/min. Thus a 15 second etch would remove 0.04 μm of photoresist and reduce a 0.33 μm linewidth down to a 0.25 μm linewidth. See FIGS. 2e–f which show the etched photoresist patterns 213–214 defining a linewidth of W-2ΔW with solid lines together with the original photoresist patterns 211–212 defining a linewidth of W with broken lines.

(5) Apply an anisotropic etch to remove the exposed portions of TiN layer 208 and complete the etch mask for etching polysilicon 206. A helicon plasma etcher with chlorine at a pressure of 6 mTorr will etch TiN at about 200 nm/min, so an etch of roughly 15 seconds will remove exposed TiN to leave TiN portions 217–218. This etch will also etch polysilicon at roughly the same rate, but stopping in polysilicon 206 is not critical because polysilicon 206 will be anisotropically etched next anyway. FIGS. 2g–h illustrate the final photoresist patterns 213–214 on underlying TiN portions 217–218 which form the mask with W-2ΔW minimum linewidth to be used for anisotropic etching of polysilicon 206.

The anisotropic etching of polysilicon 206 then proceeds with a helicon excited plasma from a gas mixture of $Cl_2$, HBr, and $He/O_2$ (80%/20%) at a pressure of about 6 mTorr and using the photoresist patterns 213–214 as etch mask. The Br provides sidewall passivation to insure anisotropy. $Cl_2/HBr/He—O_2$ plasma may etch polysilicon about 300 times faster than oxide, and an overetch on oxide 204 will only remove a minimal amount of oxide; see FIG. 3. A final oxygen plasma strips the photoresist plus a chlorine plasma or an SC1 rinse ($NH_4OH+H_2O_2+H_2O$ solution) strips the TiN from the etched polysilicon without affecting either the polysilicon or the exposed gate oxide.

Second preferred embodiment

FIGS. 4a–d illustrate the second preferred embodiment photoresist patterning method as could also be used to form a mask for gate level polysilicon etching. In particular, again begin with monocrystalline silicon substrate 402 having (100) orientation with isolation oxides 403, gate oxide 404 with thickness 6 nm plus gate level polysilicon layer 406 with thickness 400 nm. Then proceed with the following steps:

(1) Spin on a 200 nm thick layer 408 of organic BARC onto polysilicon 406. That is, organic BARC layer 408 strongly absorbs 365 nm wavelength light. Organic BARC 408 may be a polymer with attached dye groups which provide the absorption but without change in polymer bonds; for example, polyamic acid polymers and copolymers. As previously noted, without some sort of BARC, the underlying polysilicon 406 would reflect exposure light penetrating overlying photoresist 410 and cause interference which would make the photoresist's degree of exposure depend upon location because the photoresist thickness varies.

(2) Spin roughly 1 μm thick photoresist layer 410 onto BARC layer 408; the thickness of layer 410 depends on the underlying topography. See FIG. 4a for a cross sectional elevation view.

Figure 4A:
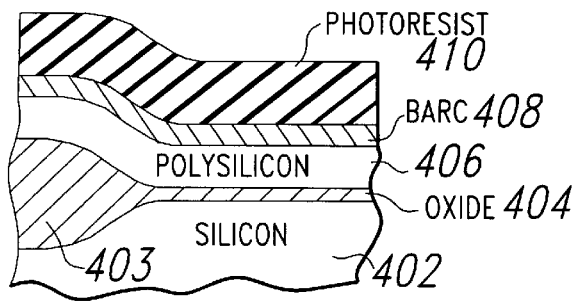
FIGS. 4a–d illustrate a second preferred embodiment method of photoresist patterning.
Figure 4B:
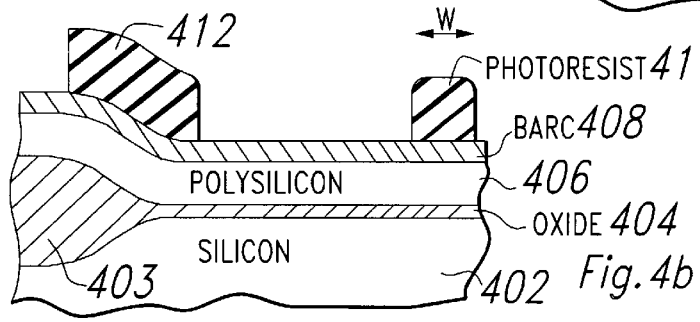
Figure 4C:
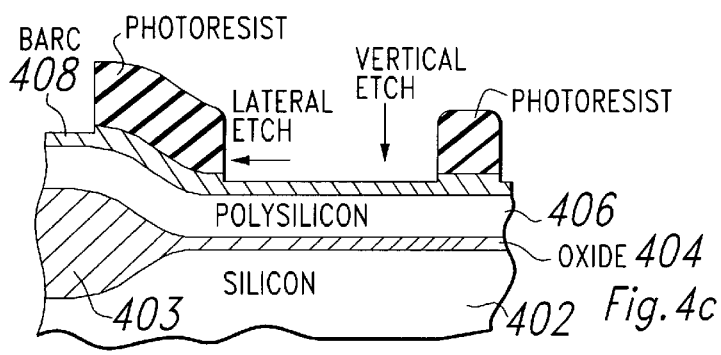

(3) Expose photoresist 410 with an I-line lithography system to define a pattern with minimum linewidth of 0.30 μm. Then develop the photoresist and bake to yield patterned photoresist portions 411 and 412 as illustrated in FIG. 4b. The width denoted "W" may be a minimum linewidth such as 0.30 μm.

Figure 4D:
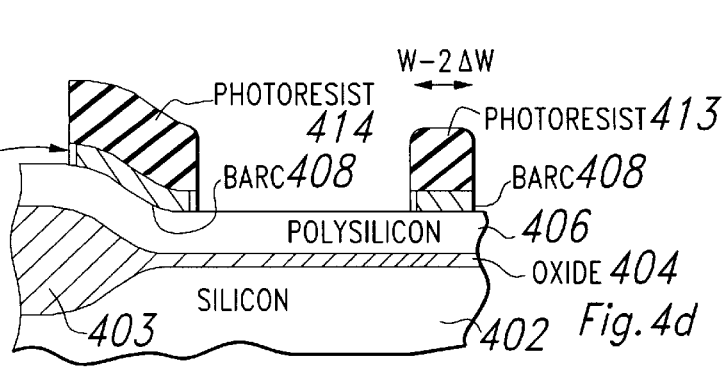
Figure 5:
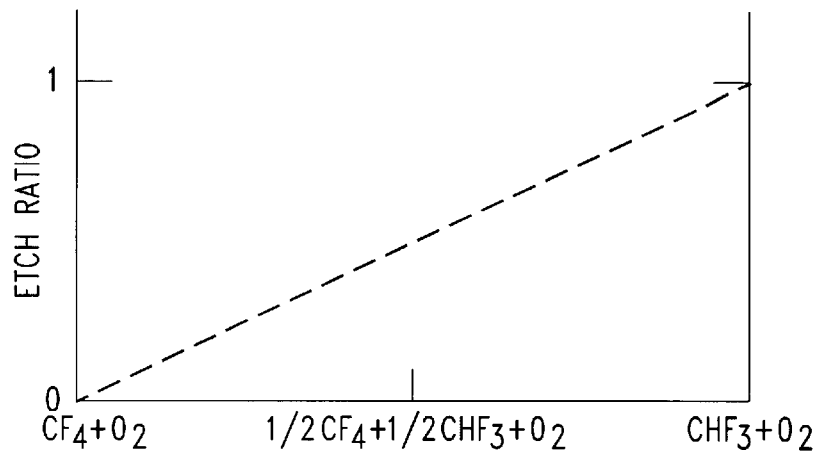
FIG. 5 suggests etch selectivity.

(4) Etch using a mixture of $CHF_3/CF_4/O_2$ or $CHF_3/O_2$ at a pressure of 25–75 mTorr in a parallel plate plasma etcher to anisotropically remove the exposed portion of BARC layer 408. This etch also removes photoresist isotropically with a rate dependent upon the $CHF_3$ to $CF_4$ ratio: a mixture of $CHF_3$ and $O_2$ removes photoresist (which may be based on a polymer of isoprene) at roughly the same rate as it removes BARC, whereas $CF_4$ and $O_2$ does not rapidly remove photoresist. FIG. 5 suggests the photoresist-to-BARC etch ratio as a function of gas mixture. Thus by selecting the gas mixture, ΔW of photoresist patterns 411–412 can be removed during the BARC etch for any desired ΔW from 0 up to 200 nm to yield photoresist patterns 413–414 with linewidth W-2ΔW. For example, the lithographically defined linewidth of 0.30 μm can be reduced down to a 0.25 μm linewidth during the BARC removal with overetch if the lateral etch rate of photoresist is about 1/10 the vertical etch rate of BARC. See FIGS. 4c–d which show the lateral and vertical etches and the etched photoresist patterns 413–414 defining a mask with linewidth of W-2ΔW for etching polysilicon 406.

Figure 6:
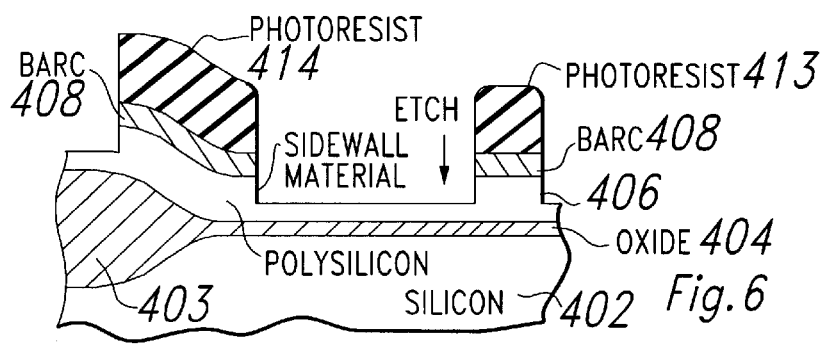
FIG. 6 illustrates a polysilicon etch.

The etching of polysilicon 406 then proceeds with a plasma from a gas mixture of $SF_6$ plus HBr using the photoresist patterns 413–414 as etch mask. The Br provides sidewall passivation for anisotropy. Further, the BARC etch of step (4) deposits material 450 on the BARC sidewall as illustrated in FIG. 4d; and during the polysilicon etch this sidewall material migrates down the forming polysilicon sidewall as illustrated in FIG. 6 and limits microtrenching at the sidewall base. Use a $Cl_2/HBr/He—O_2$ plasma etch to finish and overetch because this mixture etches polysilicon about 300 times faster than oxide, and an overetch on oxide 404 will only remove a minimal amount of oxide. A final oxygen plasma strips the patterned photoresist plus BARC.

Various anisotropic polysilicon etches have differing amounts of intrinsic linewidth reduction. Consequently, use of the second preferred embodiment allows compensation for the polysilicon etch by adjusting the BARC etch gas mixture so that the total linewidth reduction (photoresist linewidth reduction by BARC etch plus linewidth reduction by polysilicon etch) remains constant.

Third preferred embodiment

Figure 7A:
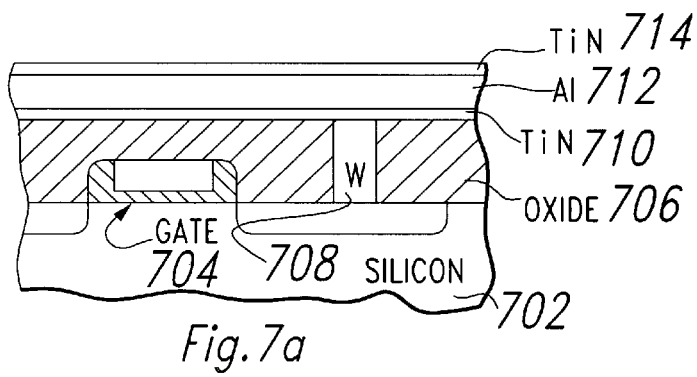
FIGS. 7a–b show in a cross sectional elevation views a third preferred embodiment method.

The third preferred embodiment again uses an isotropic etch to reduce the minimum linewidth of a photoresist mask with TiN antireflective coating in the case of a metal etch. In particular, aluminum interconnections often have TiN cladding to act as diffusion barriers and electromigration suppressors. Thus FIG. 7a shows silicon substrate 702 with insulated gate 704 and planarized oxide insulation 706 having a tungsten filled via 708 connecting down to the source/drain of the FET with gate 704 plus layer 712 of aluminum clad by layers 710 and 714 of TiN.

Figure 7B:
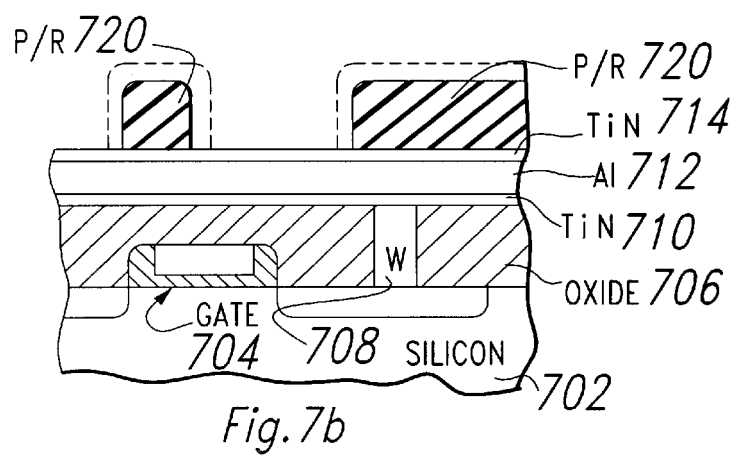

Next, spin on photoresist 720 and expose with masked I-line light for a pattern with linewidth W; top TiN cladding 714 acts as the antireflective coating. Develop photoresist 720 and then apply an oxygen plasma etch to shrink patterned photoresist 720 linewidth to W-2ΔW using the top TiN cladding 714 as an etchstop; see FIG. 7b showing the patterned photoresist shrinkage.

Then apply a chlorine based anisotropic etch to remove TiN 714, Al 712, and TiN 710 not masked by patterned photoresist 720. Strip the patterned photoresist 720 with an oxygen plasma. In this case the structural layer of TiN 714 also acted as the buried antireflective coating and the photoresist linewidth shrink etchstop.

Fourth preferred embodiment

FIGS. 8a–d illustrate the fourth preferred embodiment method as could also be used to form a mask for gate level polysilicon etching. In particular, again begin with monocrystalline silicon substrate 802 having (100) orientation with isolation oxides 803, gate oxide 804 with thickness 6 nm plus gate level polysilicon layer 806 with thickness 400 nm. Then proceed with the following steps:

(1) Deposit a 200 nm thick TiN layer 808, which acts as I-line BARC, onto polysilicon 806. TiN deposition may be by sputtering Ti in a $N_2$ plasma or sputtering TiN. As previously described, BARC 808 limits reflective interference in an overlying photoresist layer which would otherwise make the photoresist's degree of exposure depend upon location because the photoresist thickness varies.

(2) Spin roughly 1 $\mu$m thick photoresist layer 810 onto BARC layer 808; the thickness of layer 810 depends on the underlying topography. See FIG. 8a for a cross sectional elevation view.

Figure 8A:
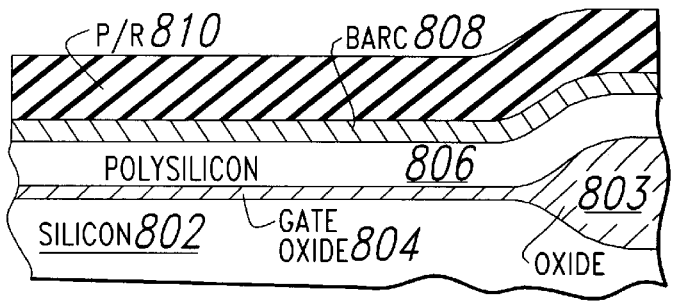
FIGS. 8a–e are cross sections of a fourth preferred embodiment method.
Figure 8B:
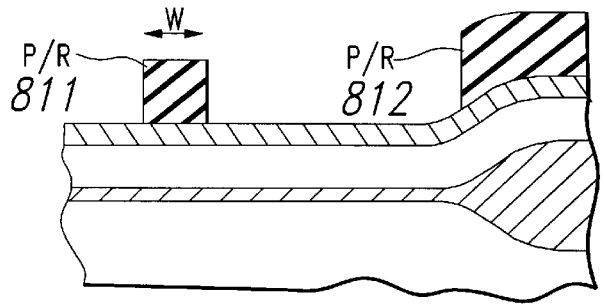

(3) Expose photoresist 810 with an I-line lithography system to define a pattern with minimum linewidth of 0.30 $\mu$m. Then develop the photoresist and bake to yield patterned photoresist portions 811 and 812 as illustrated in FIG. 8b. The width denoted "W" may be a minimum linewidth such as 0.30 $\mu$m.

Figure 8C:
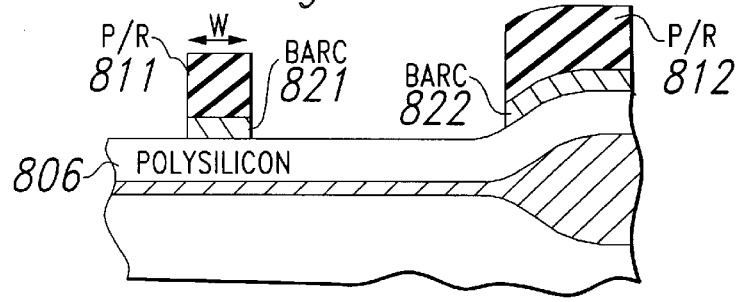

(4) Apply an anisotropic etch to remove the exposed portions of BARC layer 808; see FIG. 8c. For TiN BARC a helicon plasma etcher with chlorine at a pressure of 6 mTorr will etch TiN at about 200 nm/min, so an etch of roughly 60 seconds will remove exposed TiN to leave BARC portions 821–822. This etch will also etch polysilicon at roughly the same rate, but stopping at polysilicon 806 is not critical because polysilicon 806 will be anisotropically etched in step (6).

Figure 8D:
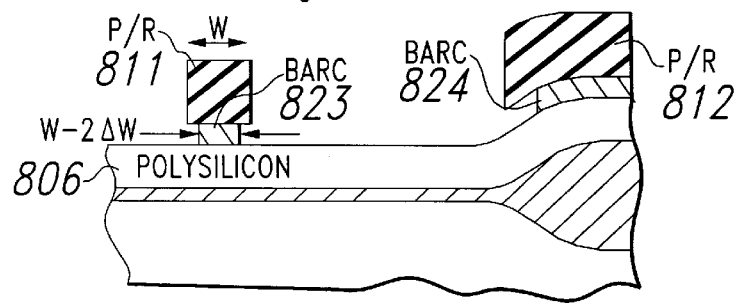

(5) Apply a timed isotropic etch to laterally remove about 0.025 $\mu$m of BARC 821–822 to form narrowed BARC portions 823–824 of minimal width 0.25 $\mu$m; see FIG. 8d showing the minimal linewidth of W-2ΔW. The isotropic etch for TiN BARC may be a wet etch of dilute $H_2O_2$ which etches TiN at about 5 nm/min, so this would be a 5 minute etch. Note that overlying photoresist 811–812 limits the amount of BARC exposed to any etchant and thereby greatly diminishes proximity effects to insure a uniform removal of the lateral 0.025 $\mu$m of BARC over an entire wafer. Similarly, an isotropic plasma etch could be used. The narrowed BARC 823–824 forms the final etch mask with W-2ΔW minimum linewidth to be used for anisotropic etching of polysilicon 806.

Figure 8E:
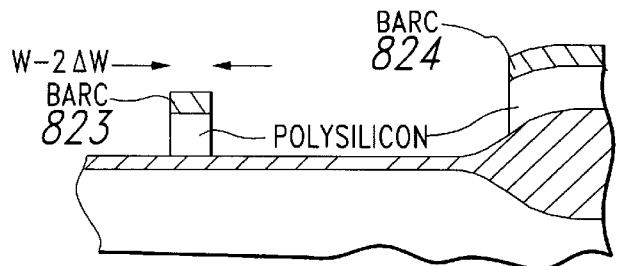
Figure 9A:
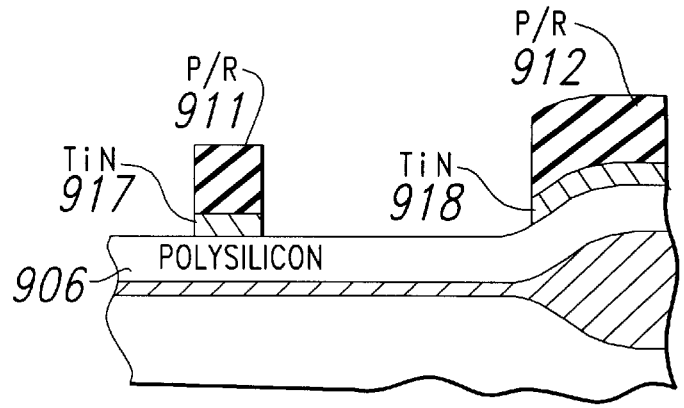
FIG. 9a–d illustrate in cross sectional elevation views a fifth preferred embodiment method.
Figure 9B:
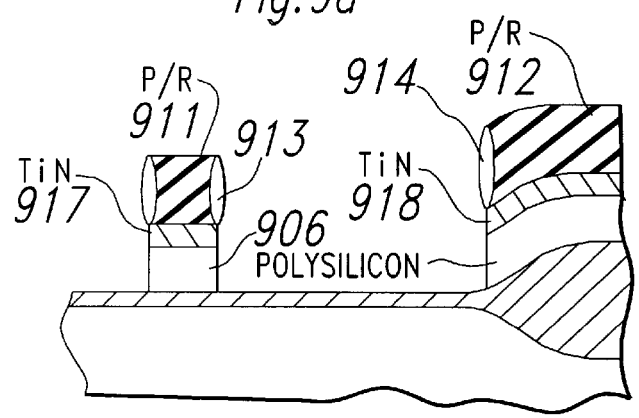
Figure 9C:
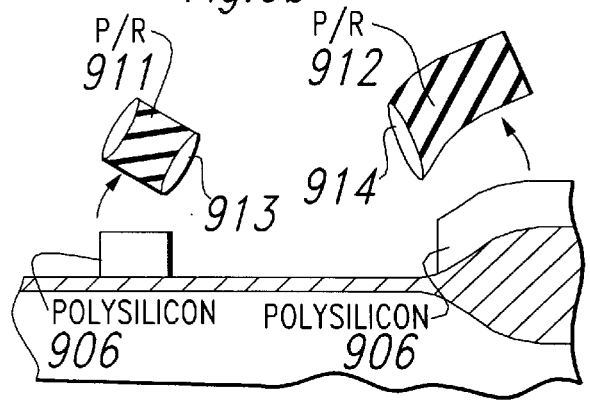
Figure 9D:
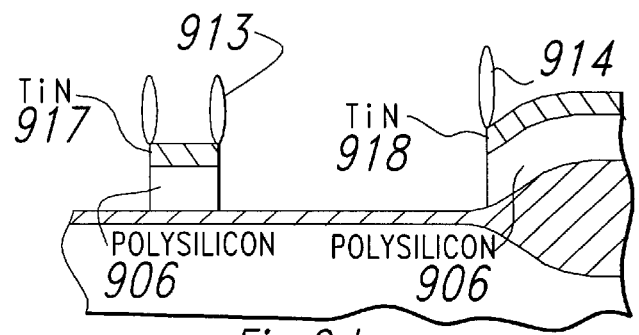

(6) First strip overlying photoresist 811–812 with an oxygen plasma, and then anisotropically etch polysilicon 806 with the BARC 823–824 as etch mask. Note that the thickness of BARC 823–824 permits use of a somewhat nonselective anisotropic polysilicon etch; that is, a plasma etch may also remove the BARC provided that it removes the polysilicon at least twice as rapidly. See FIG. 8e. Lastly, strip the BARC to leave the sublithographically patterned polysilicon.

Note that use of an organic BARC would also be possible provided that the photoresist could be removed without also removing the BARC.

Fifth preferred embodiment

FIGS. 9a–d illustrate the fifth preferred embodiment method as could also be used with any of the foregoing preferred embodiment linewidth reduction methods or could be used without them. The fifth preferred embodiment uses the intermediate layer (possibly BARC) as a liftoff to remove the overlying photoresist or photoresist residue according to the following steps.

(1) Begin with patterned photoresist 911–912 on 50 nm thick TiN intermediate layer portions 917–918 which, in turn, lie on 300 nm thick polysilicon 906. The TiN acted as the BARC for the patterning of the photoresist and, optionally, photoresist 911–912 may have been isotropically etched to shrink linewidth analogous to the structure of FIG. 2g. See FIG. 9a.

(2) Anisotropically etch polysilicon 906 with a Cl and Br based plasma with photoresist 911–912 plus TiN 917–918 as the etch mask. The etch plasma also forms hardened photoresist portions 913–914 from the sidewalls of photoresist 911–912. See FIG. 9b.

(3) Dissolve TiN 917–918 in a solution such as SC1 (1 part 29% $NH_4OH$, 1 part 30% $H_2O_2$, and 6 parts $H_2O$); this also lifts off photoresist 911–912 along with hardened sidewall portions 913–914. See FIG. 9c. Optionally, prior to dissolution of TiN 917–918, ash photoresist 911–912 with an oxygen plasma and then dissolve TiN 917–918. This prior ashing exposes another surface of TiN 917–918 for quicker dissolution and still permits liftoff of the hardened sidewall portions 913–914 which the oxygen plasma fails to remove. See FIG. 9d which shows the structure after photoresist ashing but prior to the TiN dissolution.

Intermediate layer 917–918 may have been an organic BARC layer, and the method would follow the same steps with BARC dissolution by organic solvent providing the liftoff of the hardened sidewall portions 913–914. However, organic BARC sidewalls would likely also become hardened, so dissolution may require a particular solvent adapted to the type of BARC used. And using an intermediate layer under photoresist for liftoff of hardened sidewalls also applies to etching metal levels, analogous to the third preferred embodiment, and to etching vias through insulators.

Modifications and variations

The preferred embodiments may be varied in many ways while retaining one or more of the features of use of an intermediate layer which may act as a buried antireflective coating, as an etchstop or sacrificial layer for linewidth reduction, and as a liftoff for overlying photoresist or residue or other material.

For example, the photoresist of the first, second, and third preferred embodiments could be stripped and the patterned BARC alone used as the etch msk provided the etch is selective enough with respect to the BARC. The isotropic etch to reduce photoresist linewidth could be somewhat anisotropic provided sufficient photoresist remains. The layer thicknesses and linewidths and etch chemistries and conditions could all be varied. Further, the preferred embodiment descriptions all used I-line lithography, whereas with other exposure wavelengths using the same or different photoresist and antireflective coatings the same approach works. Further, variations could use a single wafer helicon plasma etcher or other types of plasma etchers including batch RIE, ECR RIE, and inductively coupled plasmas.

What is claimed is:

1. A method of lithography, comprising the steps of:
   (a) providing a bottom layer to be patterned;
   (b) forming an intermediate layer over said bottom layer;
   (c) forming a radiation sensitive top layer over said intermediate layer;
   (d) patterning said top layer with radiation to form a patterned top layer;
   (e) simultaneously laterally removing portions of said patterned top layer and vertically removing exposed portions of said intermediate layer to form a reduced patterned top layer on a patterned intermediate layer; and
   (f) removing portions of said bottom layer using said patterned intermediate layer as at least a portion of a mask.

2. The method of claim 1, wherein:
   (a) said intermediate is made of organic polymer; and
   (b) said top layer is made of photoresist.

3. The method of claim 2, wherein:
   (a) said simultaneously removing is by plasma etching.

4. The method of claim 3, wherein:
   (a) said bottom layer is polysilicon; and
   (b) said removing portions of said bottom layer is by anisotropic plasma etching.

5. A method of sublithographic patterning, comprising the steps of:
   (a) providing a bottom layer to be patterned;
   (b) forming a buried antireflective coating (BARC) layer on said bottom layer, said BARC layer absorptive of radiation of a first wavelength;
   (c) forming a photoresist layer on said BARC layer, said photoresist layer exposible by radiation with said first wavelength;
   (d) patterning said photoresist layer with radiation including said first wavelength to form a first patterned layer of photoresist with minimum linewidth of W;
   (e) simultaneously etching said first patterned layer to remove an amount $\Delta W$ from all surfaces of said first patterned layer in a direction along a surface of said BARC layer and etching said BARC layer to remove exposed portions to form a second patterned layer of photoresist with minimum linewidth of $W-2\Delta W$ on a patterned BARC layer; and
   (g) anisotropically etching said bottom layer using said second patterned layer and patterned BARC layer as etch mask.

* * * * *